(12) United States Patent
Chakrabarti et al.

(10) Patent No.: US 9,780,725 B2
(45) Date of Patent: Oct. 3, 2017

(54) IMPROVING OSCILLATOR PHASE NOISE USING ACTIVE DEVICE STACKING

(71) Applicant: INTERNATIONAL BUSINESS MACHINES CORPORATION, Armonk, NY (US)

(72) Inventors: Anandaroop Chakrabarti, New York, NY (US); Mark Ferriss, Tarrytown, NY (US); Bodhisatwa Sadhu, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/341,640

(22) Filed: Nov. 2, 2016

(65) Prior Publication Data

US 2017/0077871 A1 Mar. 16, 2017

Related U.S. Application Data

(63) Continuation of application No. 14/831,907, filed on Aug. 21, 2015, now Pat. No. 9,559,667.

(51) Int. Cl.
*H03B 5/12* (2006.01)
*H03B 1/04* (2006.01)
*H03K 3/013* (2006.01)

(52) U.S. Cl.
CPC ............. *H03B 1/04* (2013.01); *H03B 5/1212* (2013.01); *H03B 5/1215* (2013.01);
(Continued)

(58) Field of Classification Search
CPC .......... H03B 5/08; H03B 5/12; H03B 5/1206; H03B 5/1212; H03B 5/1215;
(Continued)

(56) References Cited

U.S. PATENT DOCUMENTS 2,771,584 A 11/1956 Thomas
3,206,682 A 9/1965 Meurer
(Continued)

FOREIGN PATENT DOCUMENTS

CN 1431770 7/2003
CN 101753100 6/2010
(Continued)

OTHER PUBLICATIONS

Roberto Aparicio, "A Noise-Shifting Differential Colpitts VCO", IEEE Journal of Solid-State Circuits, Dec. 2002, pp. 1738-1735, vol. 37, N. 12.
(Continued)

*Primary Examiner* — Levi Gannon
(74) *Attorney, Agent, or Firm* — Tutunjian & Bitetto, P.C.; Vazken Alexanian (57) ABSTRACT

An integrated electronic circuit is provided. The integrated electronic circuit includes a transconductance cell formed from transconductance cell devices. The integrated electronic circuit further includes active and passive decoupling circuits. The integrated electronic circuit also includes an oscillator having a tank that is direct current decoupled from the transconductance cell devices using the active and passive decoupling circuits to increase voltage swing and decrease phase noise of the oscillator.

8 Claims, 9 Drawing Sheets

(52) U.S. Cl.
CPC ......... *H03B 5/1221* (2013.01); *H03B 5/1228* (2013.01); *H03B 5/1231* (2013.01); *H03B 5/1265* (2013.01); *H03K 3/013* (2013.01); *H03B 2200/009* (2013.01)

(58) Field of Classification Search
CPC .. H03B 5/1221; H03B 5/1228; H03B 5/1231; H03B 5/124; H03B 5/1243; H03B 2200/009
USPC ................................ 331/117 FE, 117 R, 167
See application file for complete search history.

(56) References Cited

U.S. PATENT DOCUMENTS

| | | | |
|---|---|---|---|
| 3,262,072 A | 7/1966 | Crandall | |
| 3,297,962 A | 1/1967 | Kozuma et al. | |
| 3,909,748 A | 9/1975 | Yuan et al. | |
| 6,064,227 A | 5/2000 | Saito | |
| 6,359,522 B1 | 3/2002 | Ikarashi | |
| 6,700,451 B1* | 3/2004 | Peckham | H03B 5/1228 331/117 FE |
| 6,946,924 B2 | 9/2005 | Chominski | |
| 6,952,140 B2 | 10/2005 | Tamaru | |
| 7,057,469 B2* | 6/2006 | Prentice | H03K 3/2821 331/117 FE |
| 7,821,349 B2* | 10/2010 | Park | H03F 1/223 330/302 |
| 7,884,677 B2* | 2/2011 | Sutardja | H03B 5/1228 331/117 FE |
| 8,081,039 B1* | 12/2011 | Venca | H03B 5/1228 331/113 R |
| 8,102,216 B1 | 1/2012 | Kaczynski | |
| 8,111,110 B2 | 2/2012 | Yamakawa et al. | |
| 8,773,215 B2 | 7/2014 | Sadhu et al. | |
| 8,933,757 B2 | 1/2015 | Shirinfar et al. | |
| 2003/0146795 A1* | 8/2003 | Albon | H03B 5/1228 331/36 C |
| 2004/0130369 A1* | 7/2004 | Hong | H03K 3/354 327/215 |
| 2007/0205844 A1 | 9/2007 | Zirath | |
| 2009/0072919 A1* | 3/2009 | Lee | H03B 5/1215 331/117 FE |
| 2011/0018646 A1* | 1/2011 | Lee | H03B 5/1221 331/117 FE |
| 2011/0156829 A1* | 6/2011 | Wang | H03L 7/0802 331/117 FE |
| 2012/0249250 A1* | 10/2012 | Cheng | H03B 27/00 331/45 |
| 2014/0097910 A1 | 4/2014 | Breslin et al. | |
| 2014/0266479 A1* | 9/2014 | Rong | H03B 5/1228 331/117 FE |
| 2014/0368286 A1 | 12/2014 | Sun | |
| 2015/0244317 A1* | 8/2015 | Lv | H03B 5/1228 331/115 |

FOREIGN PATENT DOCUMENTS

| | | |
|---|---|---|
| CN | 203206179 | 9/2013 |
| CN | 104135233 | 11/2014 |
| GB | 2494497 | 3/2013 |
| KR | 20120091630 | 8/2012 |

OTHER PUBLICATIONS

Masoud Babaie, "A Class-F CMOS Oscillator", IEEE Journal of Solid-State Circuits, Dec. 2013, pp. 3120-3133, vol. 48, No. 12.
Donhee Ham, "Concepts and Methods in Optimization of Integrated LC VCOs", IEEE Journal of Solid-State Circuits, Jun. 2001, pp. 896-909, vol. 36, No. 6.
Hsu, et al., "Low Phase Noise and Low Power Consumption VCOs Using CMOS and IPD Technologies", IEEE Transactions on Components, Packaging and Manufacturing Technology, May 2011, pp. 672-680, vol. 1, No. 5.
Sadhu, et al., "A Linearized, Low-Phase-Noise VCO-Based 25-GHz PLL With Autonomic Biasing",IEEE Journal of Solid-State Circuits, May 2013, pp. 1138-1150, vol. 48, No. 5.
Zannoth, et al., "A Fully Integrated VCO at 2 GHz", IEEE Journal of Solid-State Circuits, Dec. 1998, pp. 1987-1991,vol. 33, No. 12.
List of IBM Patents or Patent Applications Treated as Related dated Nov. 2, 2016, 2 pages.
Office Action dated Jul. 17, 2017 in a corresponding U.S. Appl. No. 15/583,458, filed May 1, 2017.

* cited by examiner

IMPROVING OSCILLATOR PHASE NOISE USING ACTIVE DEVICE STACKING

GOVERNMENT RIGHTS

This invention was made with Government support under Contract No.: HR0011-12-C-0087 awarded by the Defense Advanced Research Projects Agency (DARPA). The Government has certain rights in this invention.

BACKGROUND

Technical Field

The present invention relates generally to electronic devices and, in particular, to improving oscillator phase noise in voltage controlled oscillator circuits using active device stacking.

Description of the Related Art

Phase noise in voltage controlled oscillators (VCOs) is fundamentally limited by voltage swing and device noise. Voltage swing is limited by the breakdown voltages of the involved devices. High frequency VCOs obtained in advanced technology nodes have lower device breakdown voltages. Thus, it is desirable to improve (reduce) phase noise in VCOs.

SUMMARY

According to an aspect of the present principles, an integrated electronic circuit is provided. The integrated electronic circuit includes a transconductance cell formed from transconductance cell devices. The integrated electronic circuit further includes active and passive decoupling circuits. The integrated electronic circuit also includes an oscillator having a tank that is direct current decoupled from the transconductance cell devices using the active and passive decoupling circuits to increase voltage swing and decrease phase noise of the oscillator.

According to another aspect of the present principles, a method is provided. The method includes providing a transconductance cell formed from transconductance cell devices. The method further includes providing active and passive decoupling circuits. The method also includes providing an oscillator having tank. The tank is direct current decoupled from the transconductance cell devices using the active and passive decoupling circuits to increase voltage swing and decrease phase noise of the oscillator.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles are directed to improving phase noise in voltage controlled oscillator circuits using active device stacking.

Advantageously, the present principles increase voltage controlled oscillator (VCO) voltage swing even in advanced technology nodes by using device stacking.

Figure 1:
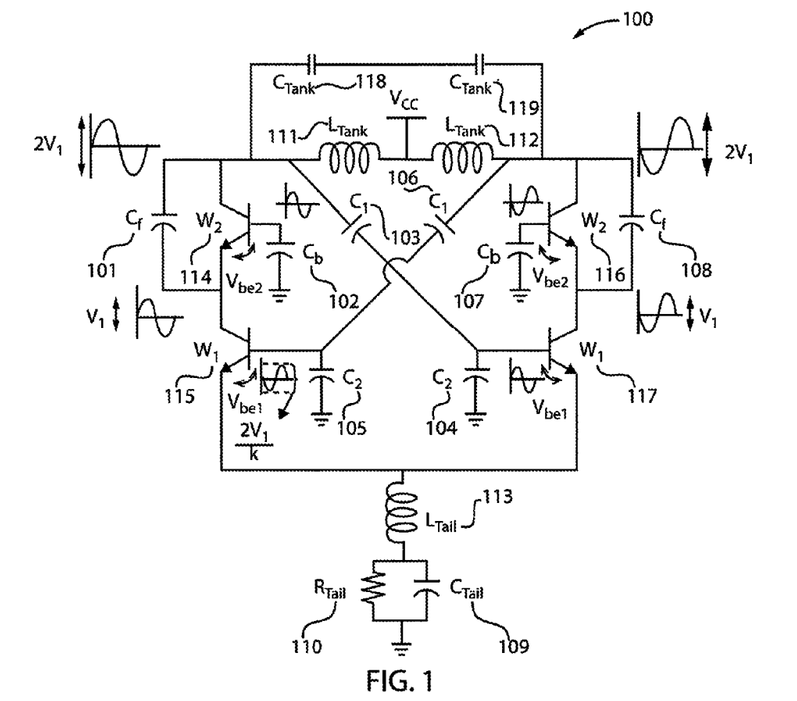
FIG. 1 shows an exemplary stacked voltage controller oscillator (VCO) 100, in accordance with an embodiment of the present principles.
Figure 2:
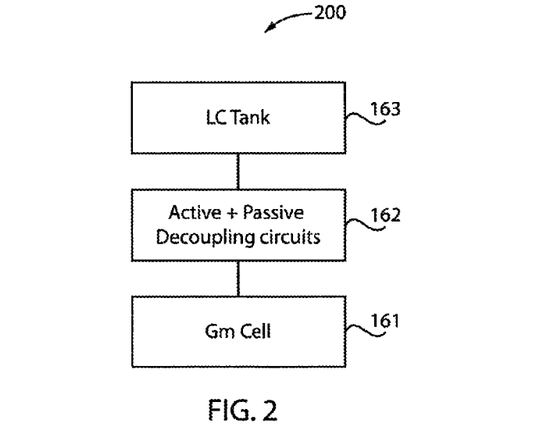
FIG. 2 shows the stacked configuration 200 of the stacked VCO of FIG. 1, in accordance with an embodiment of the present principles.

FIG. 1 shows an exemplary stacked voltage controller oscillator (VCO) 100, in accordance with an embodiment of the present principles. FIG. 2 shows the stacked configuration 200 of the stacked VCO of FIG. 1, in accordance with an embodiment of the present principles.

The stacked VCO 100 includes a LC tank that is direct current decoupled from transconductance ($G_m$) cell devices using active and passive decoupling circuits to achieve a higher voltage swing and lower phase noise.

The stacked VCO 100 includes a capacitor $C_f$ 101, a capacitor $C_b$ 102, a capacitor $C_1$ 103, a capacitor $C_2$ 104, a capacitor $C_2$ 105, a capacitor $C_1$ 106, a capacitor $C_b$ 107, a capacitor $C_f$ 108, a capacitor $C_{Tail}$ 109, a resistor $R_{Tail}$ 110, an inductor $L_{Tank}$ 111, an inductor $L_{Tank}$ 112, an inductor $L_{Tail}$ 113, a NPN bipolar junction transistor (BJT) $W_2$ 114, a NPN BJT $W_1$ 115, a NPN BJT $W_2$ 116, a NPN BJT $W_1$ 117, a capacitor $C_{tank}$ 118, and a capacitor $C_{tank}$ 119.

A description will now be given of the connections of the elements of the stacked VCO 100. A first side of capacitor $C_f$ 101 is connected to a collector of NPN BJT $W_2$ 114, a first side of capacitor $C_1$ 103, a first side of inductor $L_{Tank}$ 111, and a first side of capacitor $C_{tank}$ 118. A second side of capacitor $C_f$ 101 is connected to an emitter of NPN BJT $W_2$ 114 and a collector of NPN BJT $W_1$ 115. A second side of inductor $L_{Tank}$ 111 is connected to a first side of inductor $LT_{Tank}$ 112 and to VCC. A second side of inductor $L_{Tank}$ 112 is connected to a first side of capacitor $C_1$ 106, a first side of capacitor $C_f$ 108, a collector of NPN BJT $W_2$ 116, and a first side of capacitor $C_{tank}$ 119. A second side of capacitor $C_{tank}$ 118 is connected to a second side of capacitor $C_{tank}$ 119. A second side of capacitor $C_1$ 106 is connected to a first side of capacitor $C_2$ 105 and a base of NPN BJT $W_1$ 115. A second side of capacitor $C_f$ 108 is connected to an emitter of NPN BJT $W_2$ 116 and a collector of NPN BJT $W_1$ 117. A second side of capacitor $C_1$ 103 is connected to a first side of capacitor $C_2$ 104 and a base of NPN BJT $W_1$ 117. An emitter of NPN BJT $W_1$ 117 is connected to an emitter of NPN BJT $W_1$ 115 and a first side of inductor $L_{Tail}$ 113. A second side of capacitor $C_2$ 105 is connected to ground. A second side of capacitor $C_2$ 104 is connected to ground. A second side of inductor $L_{Tail}$ 113 is connected to a first side of resistor $R_{Tail}$ 110 and a first side of capacitor $C_{Tail}$ 109. A second side of resistor RTail 110 is connected to ground. A second side of capacitor CTail 109 is connected to ground.

Referring to FIG. 2, the stacked configuration 200 formed in stacked VCO 100 includes a LC tank 163 stacked on active and passive decoupling circuits 162 which, in turn, are stacked on a $G_m$ (transconductance) cell 161.

The LC tank 163 is formed from inductor $L_{Tank}$ 111, inductor $L_{Tank}$ 112, capacitor $C_f$ 101, capacitor $C_f$ 108, capacitor $C_{tank}$ 118, capacitor $C_{tank}$ 119, and a series combination of capacitors $C_1$ 103 with $C_2$ 104 and $C_1$ 106 with $C_2$ 105.

The active and passive decoupling circuits 162 are formed from transistors W2 114 and W2 116 (active decoupling) and capacitors $C_1$ 103, $C_1$ 106, $C_2$ 104 and $C_2$ 105 (passive decoupling). The passive decoupling portion (capacitors 103-106) of the active and passive decoupling circuits 162 determines the ratio of voltage swings at the top collector and bottom base for optimal phase noise.

The Gm cell is formed from transistors $W_1$ 115 and $W_1$ 117.

The active circuits from active and passive decoupling circuits 162 include n active devices in a series configuration in a stack, with n (here n is equal to 1, in the case of device $W_2$) being an integer greater than or equal to one. Hence, other embodiments, multiple Ws transistors can be stacked in series to implement the active circuits from the active and passive decoupling circuits 162. The LC tank 163 is connected to a collector of a top one ($W_2$) of the n active devices in the stack, and whereby voltage swings across individual ones ($W_1$ and $W_2$) of the n active devices add up in-phase to provide a combined voltage swing that is n times higher than an individual voltage swing provided by an individual one of the n active devices.

The active and passive decoupling circuits 162 include passive elements (e.g., capacitors $C_1$ 103, $C_1$ 106, $C_2$ 104 and $C_2$ 105) for feeding back a portion of a tank swing to a base of a bottom one ($W_1$) of the n active devices in the stack so as to transform a voltage swing of a given magnitude across the tank to a voltage swing of a reduced magnitude at the base of the bottom one ($W_1$) of the n active devices in the stack to prevent a breakdown of the bottom one ($W_1$) of the n active devices.

The bottom device ($W_1$) is thus analogous to the transconductor in a single device cross-coupled VCO, while the stacked devices ($W_2$) ideally serve as current buffers. The stacked devices ($W_2$) convey the current generated by the bottom device ($W_1$) to the top collector node (the collector node of $W_2$), generating a voltage swing, which is then fed back to the bottom base (the base of $W_1$) by the transformation network M to close the feedback loop. The ratio of the voltage swings at the top collector and bottom base nodes is denoted by k. A simplified analysis as shown in FIG. 1 indicates that compared to a single device implementation (n=1) with the same total bias current ($I_{bias}$), the n times larger voltage swing across the tank in a stacked VCO results in phase noise that is correspondingly n times lower than the single device VCO.

Referring to FIG. 1, a description will now be given regarding device size and optimal biasing, in accordance with an embodiment of the present principles.

All the negative resistance current is buffered into the tank using the active common base buffer.

A device size ratio of 2:1 for W1:W2 has been found to be optimal based on simulation results. Of course, the present principles are not limited to the preceding device size ratio and, thus, other device size ratios can also be used, while maintaining the spirit of the present principles.

$V_{be}$ bias values ($V_{be1}$ and $V_{be2}$) are optimized for the given device size ratio to minimize phase noise.

Referring to FIG. 1, a description will now be given regarding the feedforward capacitors, in accordance with an embodiment of the present principles.

The feedforward capacitors include capacitor $C_f$ 101 and capacitor $C_f$ 108.

Each of the feedforward capacitors help to evenly distribute tank swing across two devices, which equalizes stress across the transistors. For example, capacitor $C_f$ 101 equalizes stress across NPN BJTs 114 and 115, and capacitor $C_f$ 108 equalizes stress across NPN BJTs 116 and 117.

Referring to FIG. 1, a description will now be given regarding the base capacitors, in accordance with an embodiment of the present principles.

The base capacitors include capacitor $C_b$ 102 and capacitor $C_b$ 107.

The base-collector junction ($Vb_{bc}$) should always be reverse-biased ($V_{bc2}$<0.6V) to prevent noise injection.

Each the base capacitors facilitate voltage swing at the implicated base to prevent the base-collector from forward-biasing.

A description will now be given of some of the many advantages of the stacked VCO 100 of FIG. 1, in accordance with an embodiment of the present principles. The tank is direct current decoupled from the $G_m$ cell devices using active circuits so as to improve swing without reducing negative resistance. Regarding the decoupling performed using active devices: (1) voltage division is performed, but no current division in opposite direction (unlike a transformer); (2) more tuning range is obtained over prior art VCOs; and (3) more phase noise benefit is obtained over prior art VCOs. It is to be appreciated that stacked amplifiers have been designed before, but do not involve feedback, and are therefore designed using different principles than those involved by disclosed embodiments of the present principles. An oscillator uses positive feedback, in order to achieve instability, leading to oscillation. This feedback in a typical oscillator is implemented by connecting the LC tank directly to the active device. In case a stacked amplifier was directly used with positive feedback, the large swing on the LC tank, when connected in positive feedback with the input active device, would break down the active device. Herein, an appropriate voltage transformation is proposed in the positive feedback network in order to maintain a low voltage swing at the active device terminals.

The ratio of the voltage swings at the top collector and bottom base nodes is denoted by k.

Figure 3:
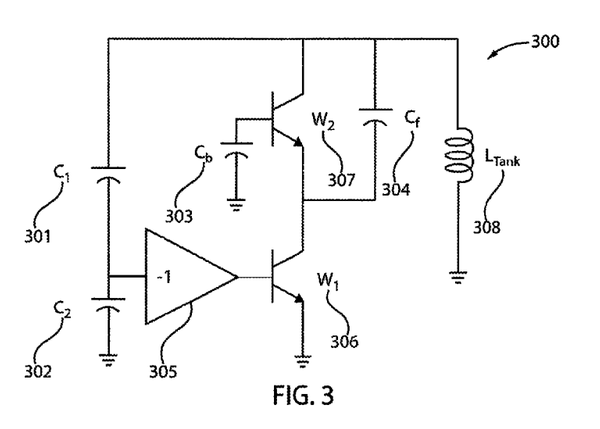
FIG. 3 shows the equivalent half-circuit 300 for the stacked VCO 100 of FIG. 1, in accordance with an embodiment of the present principles.

FIG. 3 shows the equivalent half-circuit 300 for the stacked VCO 100 of FIG. 1, in accordance with an embodiment of the present principles. The half circuit 300 includes a capacitor $C_1$ 301, a capacitor $C_2$ 302, a capacitor $C_b$ 303, a capacitor $C_f$ 304, an inverting device 305, a NPN BJT $W_1$ 306, a NPN BJT 307, and an inductor $L_{Tank}$ 308.

Figure 4:
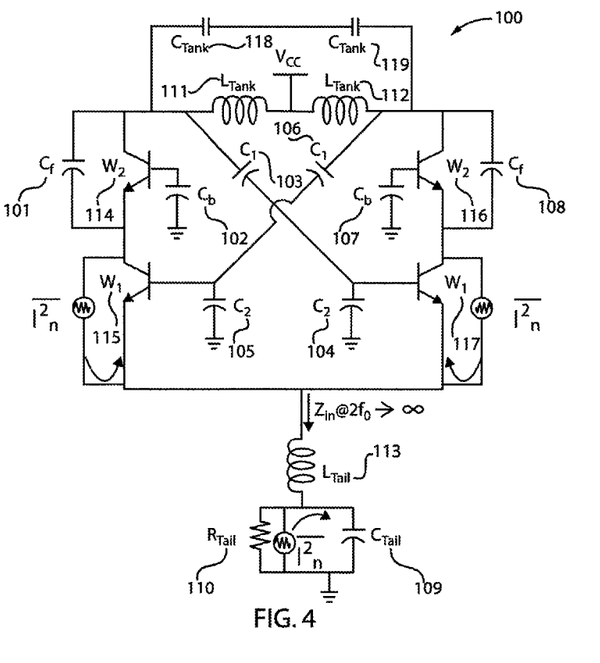
FIG. 4 shows the stacked VCO 100 of FIG. 1 with elements relating to the tail inductor for noise filtering therein emphasized, in accordance with an embodiment of the present principles.

FIG. 4 shows the stacked VCO 100 of FIG. 1 with elements relating to the tail inductor for noise filtering therein emphasized, in accordance with an embodiment of the present principles.

The tail inductor provides high impedance at the tail node for even harmonics, thereby reducing corresponding noise components.

In another embodiment (not shown), we can sue bias current control that, in turn, uses a switchable tail resistor.

The shunt capacitor $C_{Tail}$ 109 filters the noise of the resistor $R_{Tail}$ 110.

Also, the inductor LTail and capacitor CTail are designed such that the impedance (Zin) looking into the end of the inductor that is connected to the active devices is very large, ideally infinity at twice the frequency of oscillation.

Figure 5:
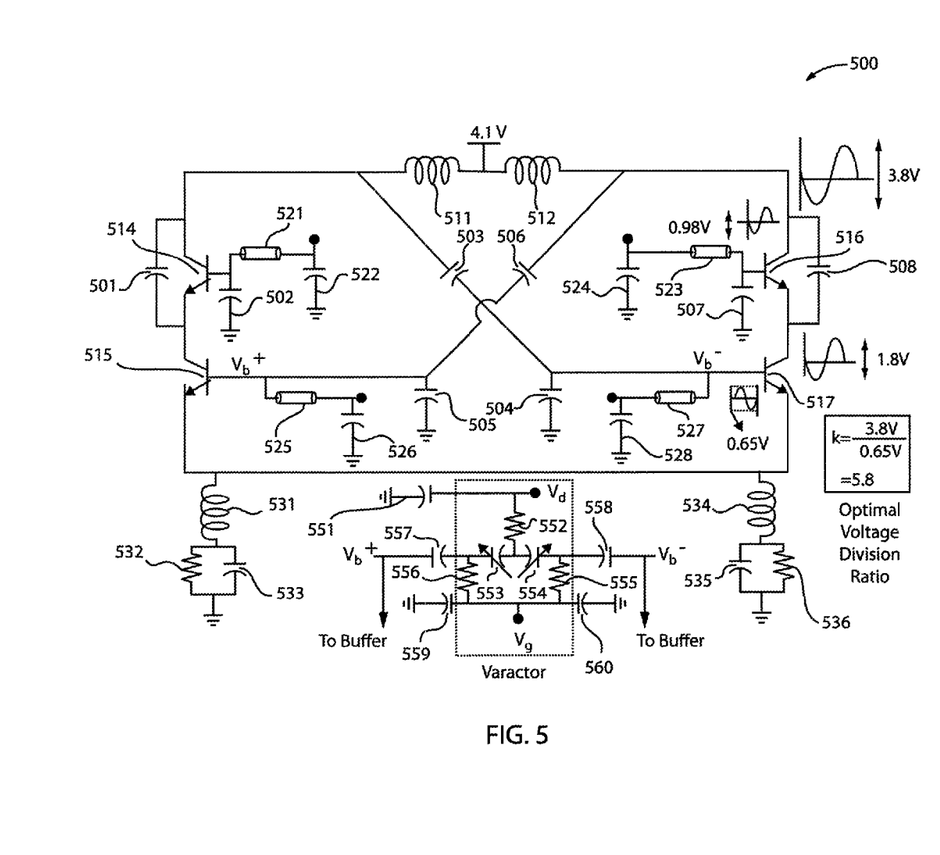
FIG. 5 shows an exemplary stacked VCO 500 configured to have a particular frequency tuning, in accordance with an embodiment of the present principles.

FIG. 5 shows an exemplary stacked VCO 500 configured to have a particular frequency tuning, in accordance with an embodiment of the present principles.

As is evident, the stacked VCO 500 is similar to the stacked VCO 100 shown in FIG. 1, but with some additional components and some modifications in order to have a particular frequency tuning. Due to the large voltage swing of the tank, varactors are implemented at the base to prevent breakdown.

The stacked VCO 500 includes a capacitor 501, a capacitor 502, a capacitor 503, a capacitor 504, a capacitor 505, a capacitor 506, a capacitor 507, a capacitor 508, a capacitor 509, a resistor 510, an inductor 511, an inductor 512, an inductor 513, a NPN bipolar junction transistor (BJT) 514, a NPN BJT 515, a NPN BJT 516, and a NPN BJT 517. The stacked VCO 500 further includes a transmission line 521, a capacitor 522, a transmission line 523, a capacitor 524, a transmission line 525, a capacitor 526, a transmission line 527, a capacitor 528, an inductor 531, a resistor 532, a capacitor 533, an inductor 534, a capacitor 535, and an inductor 536.

A description will now be given of the connections of the elements of the stacked VCO 500. A first side of capacitor 501 is connected to a collector of NPN BJT 514, a first side of capacitor 503, and a first side of inductor 511. A second side of capacitor 501 is connected to an emitter of NPN BJT 514 and a collector of NPN BJT 515. A second side of inductor 511 is connected to a first side of inductor 512 and to VCC. A second side of inductor 512 is connected to a first side of capacitor 506, a first side of capacitor 508, and a collector of NPN BJT 516. A second side of capacitor 506 is connected to a first side of capacitor 505, a base of NPN BJT 515, and a first side of transmission line 525. A second side of transmission line 525 is connected to a first side of capacitor 526. A second side of capacitor 526 is connected to ground. A second side of capacitor 508 is connected to an emitter of NPN BJT 516 and a collector of NPN BJT 517. A second side of capacitor 503 is connected to a first side of capacitor 504, a base of NPN BJT 517, and a first side of transmission line 527. A second side of transmission line 527 is connected to a first side of capacitor 528. A second side of capacitor 528 is connected to ground. An emitter of NPN BJT 517 is connected to an emitter of NPN BJT 515, a first side of inductor 531, and a first side of inductor 534. A second side of capacitor 505 is connected to ground. A second side of capacitor 504 is connected to ground. A second side of inductor 531 is connected to a first side of resistor 532 and a first side of capacitor 533. A second side of resistor 532 is connected to ground. A second side of capacitor 533 is connected to ground. A second side of inductor 534 is connected to a first side of resistor 535 and a first side of capacitor 536. A second side of resistor 535 is connected to ground. A second side of capacitor 536 is connected to ground. A base of NPN BJT 814 is connected to a first side of capacitor 502. A second side of capacitor 502 is connected to a first side of a transmission line 821. A second side of transmission line 521 is connected to a first side of capacitor 822. A second side of capacitor 522 is connected to ground. A second side of capacitor 802 is connected to ground.

The stacked VCO 500 is powered by a power supply circuit 599. The power supply circuit 599 includes a capacitor 551, a resistor 552, a varactor 553, a varactor 554, a resistor 555, a resistor 556, a capacitor 557, a capacitor 558, a capacitor 559, and a capacitor 560.

A description will now be given of the connections of the elements of the power supply circuit 599. A first side of capacitor 551 is connected to ground. A second side of capacitor 551 is connected to a first side of resistor 552 and voltage Vd. A second side of resistor 552 is connected to a first side of varactor 553 and a first side of varactor 554. A second side of varactor 553 is connected to a first side of capacitor 557 and a first side of resistor 556. A second side of capacitor 557 is connected to a voltage $V_b^+$, which is provided to a buffer. The buffer is used to drive the load of a following stage, provide isolation of the VCO from the following stage, and also perform impedance transformation. A second side of varactor 554 is connected to a first side of capacitor 958 and a first side of resistor 555. A second side of capacitor 558 is connected to a voltage $V_b^-$, which is provided to a similar buffer to that described above. It is also possible to use a single differential buffer with Vb+ and Vb− as its inputs. A second side of resistor 553 is connected to a second side of resistor 555, a first side of capacitor 559, and a first side of capacitor 560. A second side of capacitor 559 is connected to ground. A second side of capacitor 560 is connected to ground.

Although one or more embodiments herein have been described using bipolar junction transistors, it is to be appreciated that the present principles are applicable to all transistors including complimentary metal-oxide semiconductor transistors. In fact, the present principles can be more valuable using CMOS transistors, especially CMOS silicon on insulator (SOI) configurations, due to their lower breakdown voltage and isolated devices. In an embodiment, positive feedback amplifiers with a large output, or regenerative amplifiers can be designed based on the same principles.

Figure 6:
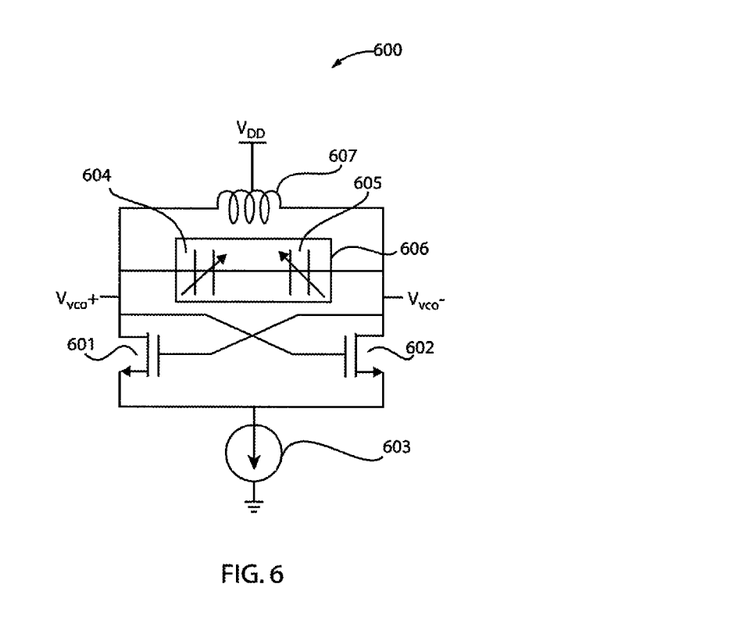
FIG. 6 shows an exemplary (non-stacked) voltage controller oscillator (VCO) 600 to which the present principles can be applied, in accordance with an embodiment of the present principles.

FIG. 6 shows an exemplary voltage controller oscillator (VCO) 600 to which the present principles can be applied, in accordance with an embodiment of the present principles. The switched capacitors 800 and 900 shown in FIGS. 8 and 9, respectively, which are described in detail herein below can be applied to a stacked VCO such as stacked VCO 100 shown in FIG. 1 or can be applied to a non-stacked VCO such as VCO 600 shown in FIG. 6. Moreover, it is to be appreciated that while the switched capacitors (800 and 900) are described herein with respect to VCOs in general, the switched capacitors (800 and 900) can also be used for other applications including, but not limited to, filters, variable loads, reflection type phase shifters, and so forth.

The VCO 600 includes a MOSFET 601, a MOSFET 602, a current source 603, a variable capacitor bank 606, and an inductor 607. The variable capacitor bank 606 includes a variable capacitor 604 and a variable capacitor 605.

The switched capacitors described herein can be used for the capacitor bank 606.

A first side of inductor 607 is connected to a first side of variable capacitor 604, a gate of MOSFET 602, and a source of MOSFET 601. A second side of inductor 607 is connected to a first side of variable capacitor 605, a gate of MOSFET 601, and a source of MOSFET 602. A second side of variable capacitor 604 is connected to a second side of variable capacitor 605. Drains of the MOSFETS 601 and 602 are connected to a first side of the current source 603. A second side of the current source 603 is connected to ground.

Figure 7:
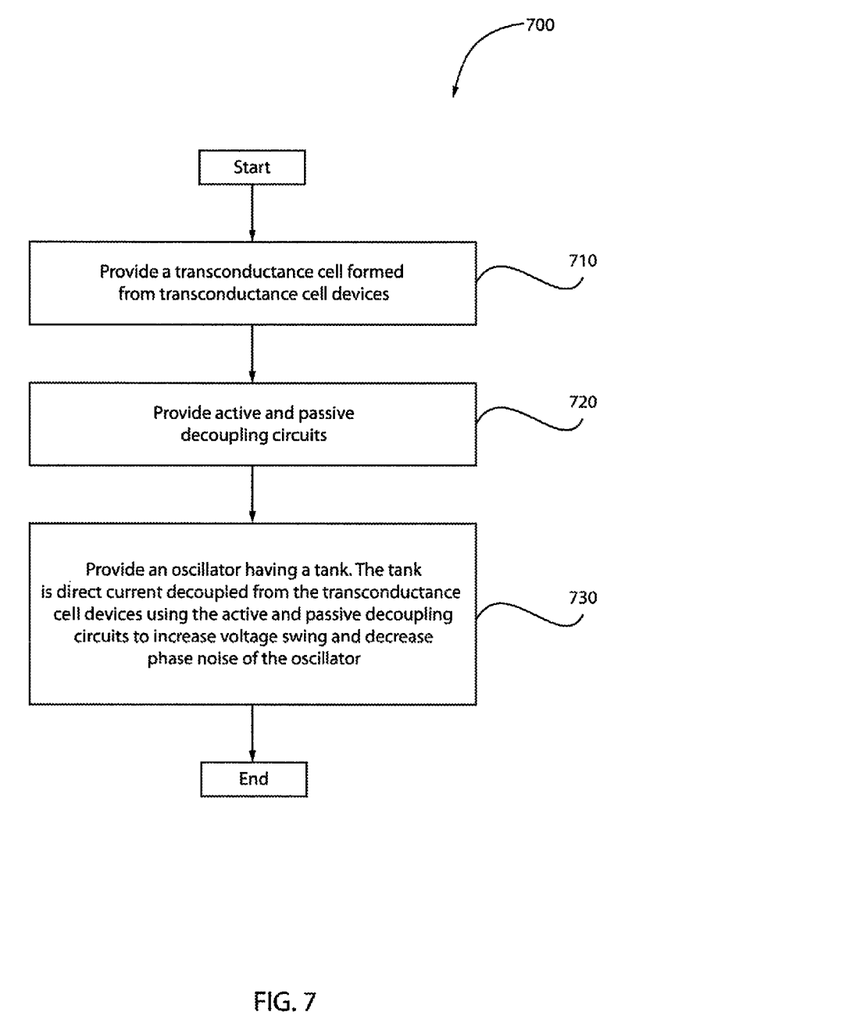
FIG. 7 shows an exemplary method 700 for providing an integrated electronic circuit having an oscillator with increased voltage swing and reduced phase noise, in accordance with an embodiment of the present principles.

FIG. 7 shows an exemplary method 700 for providing an integrated electronic circuit having an oscillator with increased voltage swing and reduced phase noise, in accordance with an embodiment of the present principles.

At step 710, provide a transconductance cell formed from transconductance cell devices.

At step 720, provide active and passive decoupling circuits.

The active and passive decoupling circuits include n active devices in a series configuration in a stack, with n being an integer greater than one, wherein voltage swings across individual ones of the n active devices add up in-phase to provide a combined voltage swing that is n times higher than an individual voltage swing provided by a single one of the n active devices.

The active and passive decoupling circuits include passive devices for feeding back a portion of a tank swing to a base or gate of a bottom one of the n active devices in the stack so as to transform a voltage swing of a given magnitude across the tank to a voltage swing of a reduced magnitude at the base or gate of the bottom one of the n active devices in the stack to prevent a breakdown of the bottom one of the n active devices.

At step 730, provide an oscillator having a tank. The tank is direct current decoupled from the transconductance cell devices using the active and passive decoupling circuits to increase voltage swing and decrease phase noise of the oscillator.

Electronic devices such as conventional voltage controlled oscillators use MOS switches. The present principles are directed to a BJT-based switch (hereinafter "BJT switch") which provides many advantages of MOS switches. For example, a BJT switch has a better RonCoff than a MOS switch. Moreover, for the same Ron and comparable phase noise, the BJT switch can yield a better tuning range.

Figure 8:
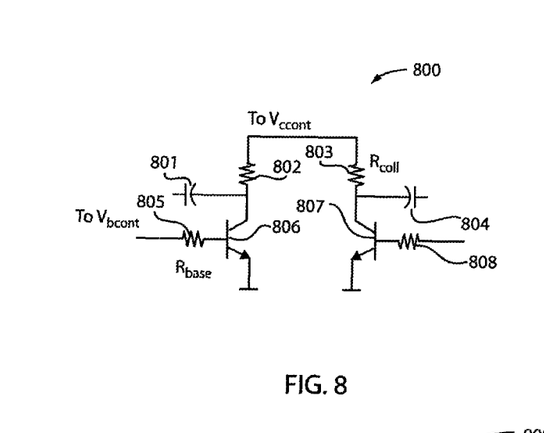
FIG. 8 shows a bipolar junction transistor (BJT) based switched capacitor 800, in accordance with an embodiment of the present principles.

FIG. 8 shows a bipolar junction transistor (BJT) based switched capacitor 800, in accordance with an embodiment of the present principles. The BJT switch 807 can be used to implement a variable capacitor using the two states of the BJT switch, as shown. The switched capacitor 800 includes a capacitor 801, a resistor 802, a resistor $R_{coll}$ 803, a capacitor 804, a resistor $R_{base}$ 805, a NPN BJT 806, a NPN BJT 807, and a resistor 808.

The BJT switch 807 has an improved $R_{on}C_{off}$ than prior art MOSFET switches. For the same $R_{on}$ and comparable phase noise, BJT switched capacitor, 800, can yield a better tuning range than prior art MOSFET switches.

It is to be appreciated that, in general, we can use only one of the stacks (left or right side) shown in FIG. 8 to provide a single ended switched capacitor, instead of the pseudo-differential switched capacitor as shown.

Figure 9:
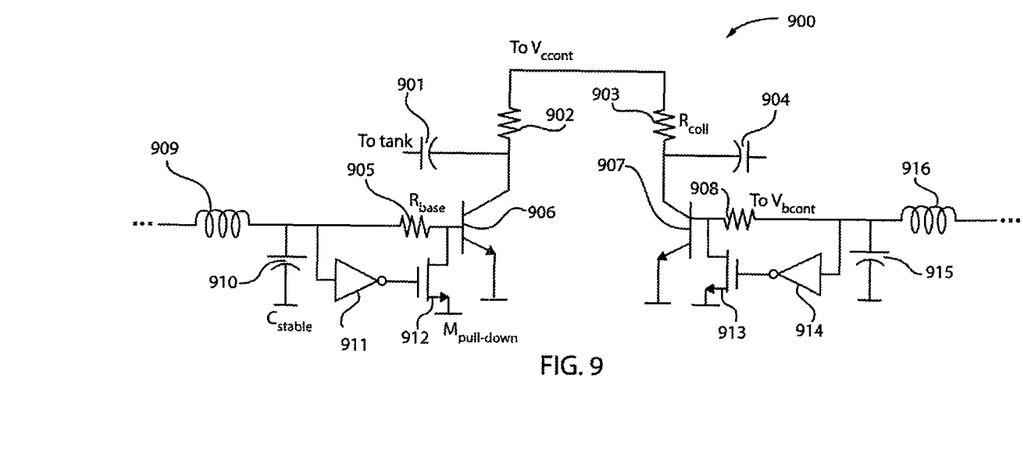
FIG. 9 shows another BJT based switched capacitor 900, in accordance with an embodiment of the present principles.

FIG. 9 shows another BJT based switched capacitor 900, in accordance with an embodiment of the present principles.

The BJT based switched capacitor 900 can be used instead of the BJT based switched capacitor 800 to obtain the benefits described below. The BJT based switched capacitor 900 includes a capacitor 901, a resistor 902, a resistor $R_{coll}$ 903, a capacitor 904, a resistor $R_{base}$ 905, an NPN BJT 906, an NPN BJT 907, a resistor $R_{base}$ 908, an inductor 909, a capacitor $C_{stable}$ 910, a digital inverter 911, a MOSFET $M_{pull-down}$ 912, a MOSFET 913, a digital inverter 914, a capacitor 915, and an inductor 916.

Resistor $R_{base}$ 908 protects NPN BJT 906 against a base-current surge.

Capacitor $C_{stable}$ 910 ensures against instability due to routing base inductance.

MOSFET $M_{pull-down}$ 912 ensures that NPN BJT 906 does not accidently turn on when OFF through a capacitive division of the collector voltage. MOSFET $M_{pull-down}$ 912 also prevents avalanche breakdown by setting $R_{base}=0$ when the device is OFF and the collector of NPN BJT 906 is swinging high. The parasitic capacitance of MOSFET $M_{pull-down}$ 912 is much smaller than switch $C_{off}$ and has no effect on FTR.

Figure 10:
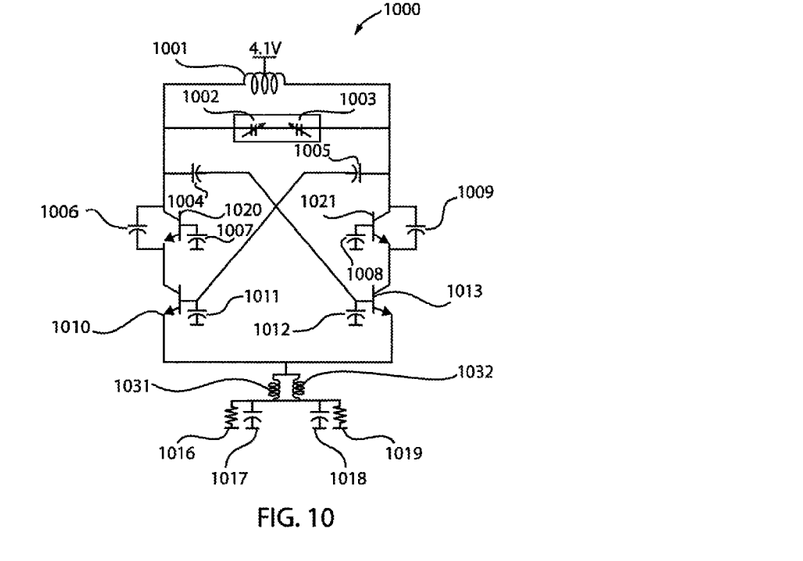
FIG. 10 shows a tunable stacked voltage controller oscillator (VCO) 1000 using bipolar junction transistor (BJT) based switched capacitors, in accordance with an embodiment of the present principles.

FIG. 10 shows a tunable stacked voltage controller oscillator (VCO) 1000 using bipolar junction transistor (BJT) based switched capacitors, in accordance with an embodiment of the present principles.

The tunable stacked VCO 1000 includes a variable inductor 1001, a variable capacitor 1002, a variable capacitor 1003, a capacitor 1004, a capacitor 1005, a capacitor 1006, a capacitor 1007, a capacitor 1008, a capacitor 1009, a NPN bipolar junction transistor (BJT) 1010, a capacitor 1011, a capacitor 1012, a NPN BJT 1013, a resistor 1016, a capacitor 1017, a capacitor 1018, and a resistor 1019, a NPN BJT 1020, a NPN BJT 1021, an inductor 1031, and an inductor 1032.

A description will now be given of the connections of the elements of the tunable stacked VCO 1000. A first side of variable inductor 1001 is connected to a first end of variable capacitor 1002, a first end of capacitor 1004, a first end of capacitor 1006, and a collector of NPN bipolar junction transistor (BJT) 1020. A second side of variable inductor 1001 is connected to a first end of variable capacitor 1003, a first end of capacitor 1005, a first end of capacitor 1009, and a collector of NPN BJT 1021. A second end of variable capacitor 1002 is connected to a second end of variable capacitor 1003. A second end of capacitor 1004 is connected to a first end of capacitor 1012 and a base of NPN BJT 1013. A second end of capacitor 1005 is connected to a first end of capacitor 1011 and a base of NPN BJT 10104. A base of NPN BJT 1020 is connected to a first side of capacitor 1007. A second side of capacitor 1007 is connected to ground. A base of NPN BJT 1021 is connected to a first side of capacitor 1008. A second side of capacitor 1008 is connected to ground. A second side of capacitor 1006 is connected to an emitter of NPN BJT 1020 and a collector of NPN BJT 1010. A second side of capacitor 1009 is connected to an emitter of NPN BJT 1021 and a collector of NPN BJT 1013. A second side of capacitor 1011 is connected to ground. A second side of capacitor 1012 is connected to ground. An emitter of NPN BJT 1010 is connected to an emitter of NPN BJT 1013, a first side of inductor 1031, and a first side of inductor 1032. A second side of inductor 1031 is connected to a second side of inductor 1032, a first side of resistor 1016, a first side of capacitor 1017, a first side of capacitor 1018, and a first side of resistor 1019. The second sides of resistor 1016, capacitor 1017, capacitor 1018, and resistor 1019 are connected to ground.

A tuning scheme with a capacitor bank with BJT switches for tuning can be included across the inductor.

Figure 11:
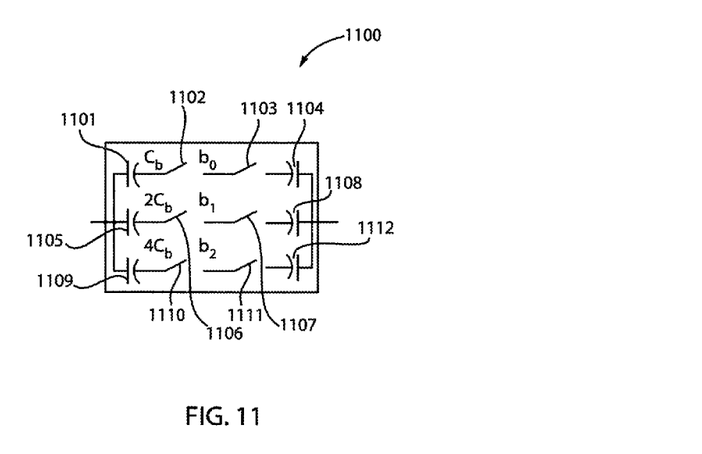
FIG. 11 shows a capacitor bank 1100 with BJT switches, in accordance with an embodiment of the present principles.

FIG. 11 shows a capacitor bank 1100 with BJT switches, in accordance with an embodiment of the present principles. The capacitor bank 1100 can be used to implement variable capacitors 1002 and 1003 in the VCO 1000 of FIG. 10.

The capacitor bank 1100 includes a capacitor 1101, a switch 1102, a switch 1103, a capacitor 1104, a capacitor 1105, a switch 1106, a switch 1107, a capacitor 1108, a capacitor 1109, a switch 1110, a switch 1111, and a capacitor 1112.

Figure 12:
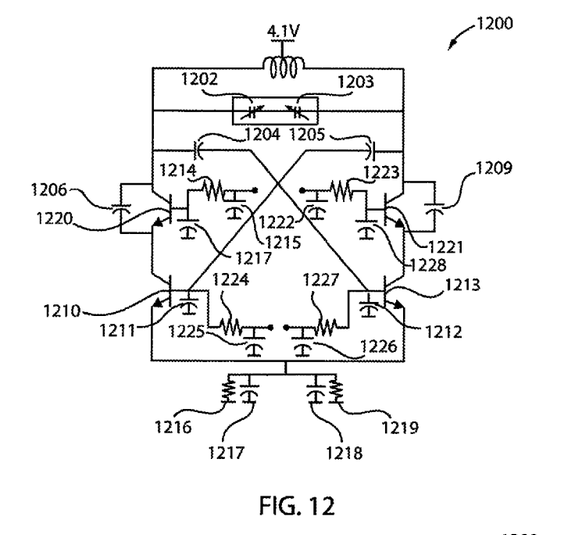
FIG. 12 shows a tunable stacked voltage controller oscillator (VCO) 1200 using bipolar junction transistor (BJT) switches with metal oxide semiconductor (MOS) varactors, in accordance with an embodiment of the present principles.

FIG. 12 shows a tunable stacked voltage controller oscillator (VCO) 1200 using bipolar junction transistor (BJT) switches with metal oxide semiconductor (MOS) varactors, in accordance with an embodiment of the present principles.

The tunable stacked VCO 1200 includes a variable inductor 1201, a variable capacitor 1202, a variable capacitor 1203, a capacitor 1204, a capacitor 1205, a capacitor 1206, a capacitor 1207, a capacitor 1208, a capacitor 1209, a NPN bipolar junction transistor (BJT) 1210, a capacitor 1211, a capacitor 1212, a NPN BJT 1213, a resistor 1214, a capacitor 1215, a resistor 1216, a capacitor 1217, a capacitor 1218, and a resistor 1219, a NPN BJT 1220, a NPN BJT 1221, a capacitor 1222, a resistor 1223, a resistor 1224, a capacitor 1225, a capacitor 1226, and a resistor 1227.

A description will now be given of the connections of the elements of the tunable stacked VCO 1200. A first side of variable inductor 1201 is connected to a first end of variable capacitor 1202, a first end of capacitor 1204, a first end of capacitor 1206, and a collector of NPN bipolar junction transistor (BJT) 1220. A second side of variable inductor 1201 is connected a first end of variable capacitor 1203, a first end of capacitor 1205, a first end of capacitor 1209, and a collector of NPN BJT 1221. A second end of variable capacitor 1202 is connected to a second end of variable capacitor 1203. A second end of capacitor 1204 is connected to a first end of capacitor 1212, a base of NPN BJT 1213, and a first side of resistor 1227. A second side of resistor 1227 is connected to a first side of capacitor 1226. A second side of capacitor 1226 is connected to ground. A second end of capacitor 1205 is connected to a first end of capacitor 1211, a base of NPN BJT 1210, and a first side of resistor 1224. A second side of resistor 1224 is connected to a first side of capacitor 1225. A second side of capacitor 1225 is connected to ground. A base of NPN BJT 1220 is connected to a first side of capacitor 1207 and a first side of resistor 1214. A second side of resistor 1214 is connected to a first side of capacitor 1215. A second side of capacitor 1215 is connected to ground. A second side of capacitor 1207 is connected to ground. A base of NPN BJT 1221 is connected to a first side of capacitor 1208 and a first side of resistor 1223. A second side of resistor 1223 is connected to a first side of capacitor 1222. A second side of capacitor 1222 is connected to ground. A second side of capacitor 1208 is connected to ground. A second side of capacitor 1206 is connected to an emitter of NPN BJT 1220 and a collector of NPN BJT 1210. A second side of capacitor 1209 is connected to an emitter of NPN BJT 1221 and a collector of NPN BJT 1213. A second side of capacitor 1211 is connected to ground. A second side of capacitor 1212 is connected to ground. An emitter of NPN BJT 1210 is connected to an emitter of NPN BJT 1213, a first side of resistor 1216, a first side of capacitor 1217, a first side of capacitor 1218, and a first side of resistor 1219. The second sides of resistor 1216, capacitor 1217, capacitor 1218, and resistor 1219 are connected to ground.

Although shown here with resistors 1216, 1219 and capacitors 1217 and 1218 at the common emitter node of the VCO, in general, the circuit shown in FIG. 12 can also be implemented using any high impedance circuit to replace the combination of 1216, 1217, 1218 and 1219. For example, a high impedance current sink can be utilized. This high impedance at the common emitter node ensures appropriate voltage swing on all nodes of the active devices to prevent them from breaking down. Without this impedance, the instantaneous voltage swing across devices 1210 and 1213 would cause these devices to break down. These and other variations of the circuit of FIG. 12 are readily determined by one of ordinary skill in the art given the teachings of the present principles provided herein, while maintaining the spirit of the present principles.

A tuning scheme with a capacitor bank with BJT switches for coarse tuning and a metal oxide semiconductor (MOS) varactor scheme for fine tuning can be included across the inductor.

Figure 13:
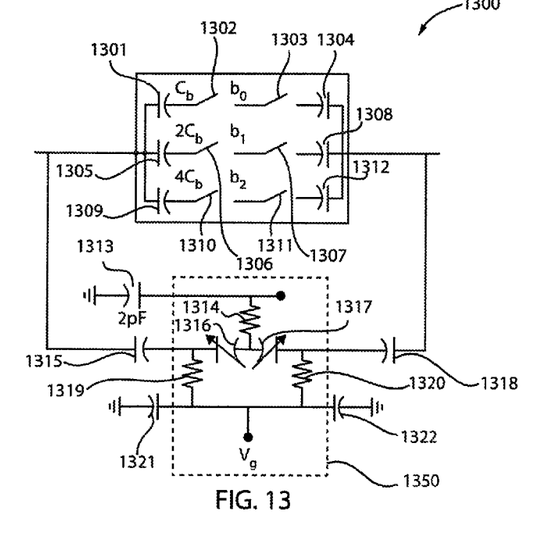
FIG. 13 shows a capacitor bank 1300 with BJT switches for coarse tuning with MOS varactors, in accordance with an embodiment of the present principles.

FIG. 13 shows a capacitor bank 1300 with BJT switches for coarse tuning with MOS varactors, in accordance with an embodiment of the present principles.

The capacitor bank 1300 includes a capacitor 1301, a switch 1302, a switch 1303, a capacitor 1304, a capacitor 1305, a switch 1306, a switch 1307, a capacitor 1308, a capacitor 1309, a switch 1310, a switch 1311, a capacitor 1312, a capacitor 1313, a resistor 1314, a capacitor 1315, a variable capacitor 1316, a variable capacitor 1317, a capacitor 1318, a resistor 1319, a resistor 1320, a capacitor 1321, and a capacitor 1322.

A varactor 1350 is formed from resistor 1314, variable capacitor 1316, variable capacitor 1317, capacitor 1318, resistor 1319, resistor 1320, capacitor 1321, and capacitor 1322.

Figure 14:
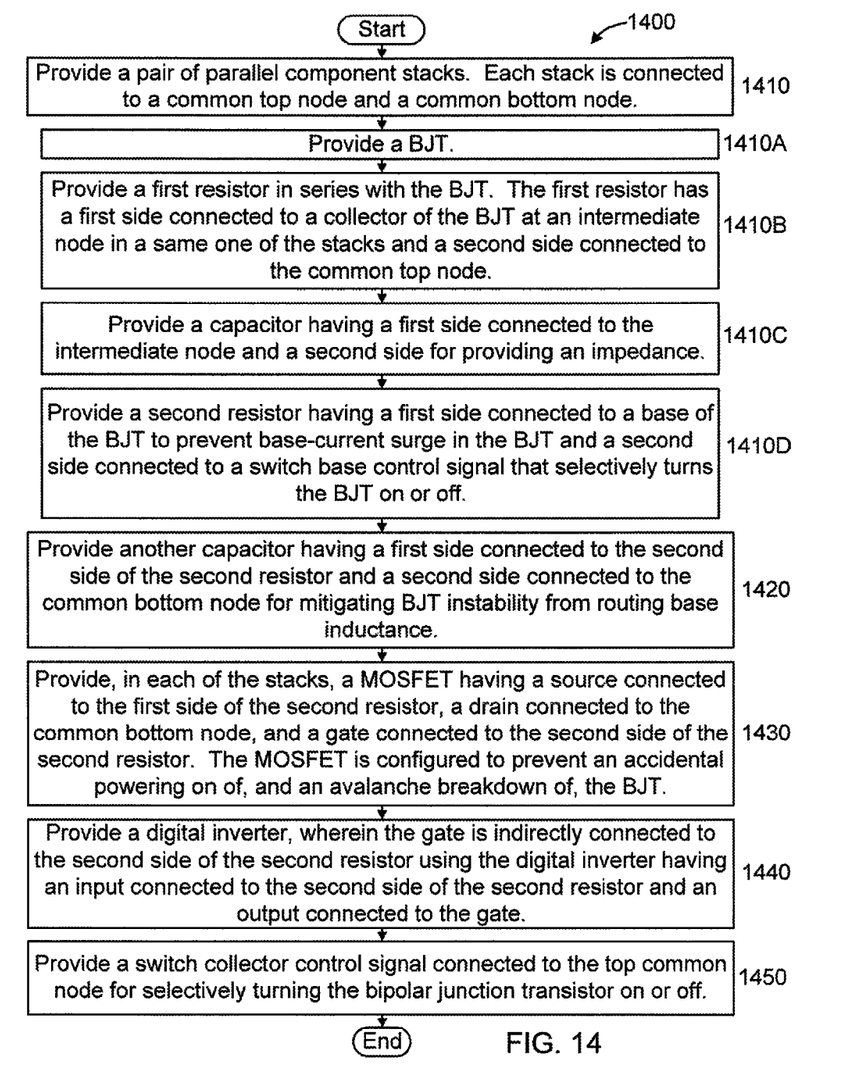
FIG. 14 shows an exemplary method 1400 for providing a switched capacitor, in accordance with an embodiment of the present principles.

FIG. 14 shows an exemplary method 1400 for providing a switched capacitor, in accordance with an embodiment of the present principles.

At step 1410, provide a pair of parallel component stacks. Each of the stacks is connected to a common top node and a common bottom node. Step 1410 includes steps 1410A through 1410D.

At step 1410A, provide a bipolar junction transistor.

At step 1410B, provide a first resistor in series with the bipolar junction transistor. The first resistor has a first side connected to a collector of the bipolar junction transistor at an intermediate node in a same one of the stacks and a second side connected to the common top node.

At step 1410C, provide a capacitor having a first side connected to the intermediate node and a second side for providing an impedance.

At step 1410D, provide a second resistor having a first side connected to a base of the bipolar junction transistor to prevent base-current surge in the bipolar junction transistor and a second side connected to a switch base control signal that selectively turns the bipolar junction transistor on or off.

At step 1420, provide another capacitor having a first side connected to the second side of the second resistor and a second side connected to the common bottom node for mitigating bipolar junction transistor instability from routing base inductance.

At step 1430, provide, in each of the stacks, a metal oxide semiconductor field effect transistor having a source connected to the first side of the second resistor, a drain connected to the common bottom node, and a gate connected to the second side of the second resistor. The metal oxide semiconductor field effect transistor is configured to prevent an accidental powering on of, and an avalanche breakdown of, the bipolar junction transistor.

At step 1440, provide a digital inverter, wherein the gate is indirectly connected to the second side of the second resistor using the digital inverter having an input connected to the second side of the second resistor and an output connected to the gate.

At step 1450, provide a switch collector control signal connected to the top common node for selectively turning the bipolar junction transistor on or off.

Thus, the bipolar junction transistor in each of the stacks is controlled using two independent signals that include the switch base control signal and the switch collector control signal. The two independent signals have different values and lack an inversion relationship when used to selectively turn on the bipolar junction transistor in each of the stacks.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An integrated electronic circuit, comprising:
active decoupling circuits, including,
   a first active device with a first capacitive device connected across the non-current control terminals of the first active device, and the current control terminal of the first active device connected to ground across a third capacitive device; and
   a second active device with a second capacitive device connected across the non-current control terminals of the second active device and the current control terminal of the second active device connected to ground across a fourth capacitive device; and
   a tank circuit that is direct current decoupled from a transconductance cell by the active decoupling circuits and a fifth and sixth capacitive device connected between the tank and the transconductance cell devices.

2. The integrated electronic device of claim 1, further comprising n active devices in a series configuration in a stack, with n being an integer greater than one, wherein the tank is connected to a collector or source of a top one of the n active devices in the stack.

3. The integrated electronic device of claim 2, wherein voltage swings across individual ones of the n active devices add up in-phase to provide a combined voltage swing that is n times higher than an individual voltage swing provided by a single one of the n active devices.

4. The integrated electronic device of claim 3, wherein the active and passive decoupling circuits perform a sign inversion to transform the voltage swing of the given magnitude to the voltage swing of the reduced magnitude.

5. The integrated electronic device of claim 3, wherein the active and passive decoupling circuits are configured to determine a ratio of voltage swings between the collector or source of the top one of the n active devices in the stack and the base or gate of the bottom one of the n active devices in the stack.

6. The integrated electronic device of claim 2, further comprising a tail inductor connected to an emitter or drain of a bottom one of then active devices in the stack.

7. The integrated electronic device of claim 6, wherein the n active devices comprise one or more metal oxide semiconductor field effect transistors or one or more bipolar junction transistors.

8. The integrated electronic device of claim 1, wherein the active decoupling circuits are in between the tank and the transconductance cell to decouple the tank from the transconductance cell.

* * * * *